Dec. 25, 1962 J. J. MORO-LIN ETAL 3,070,683

CEMENTING OF SEMICONDUCTOR DEVICE COMPONENTS

Filed Jan. 27, 1960 2 Sheets-Sheet 1

Inventors
Joseph J. Moro-Lin
Emory Taylor Lyon
By Peter J. Gaylor
Attorney

Dec. 25, 1962 J. J. MORO-LIN ETAL 3,070,683

CEMENTING OF SEMICONDUCTOR DEVICE COMPONENTS

Filed Jan. 27, 1960 2 Sheets-Sheet 2

Inventors:
Joseph J. Moro-Lin
& Emory Taylor Lyon
By. Peter J. Taylor
Attorney.

United States Patent Office 3,070,683

Patented Dec. 25, 1962

3,070,683

CEMENTING OF SEMICONDUCTOR DEVICE COMPONENTS

Joseph J. Moro-Lin, 12–94 Plaza Road, Fair Lawn, N.J., and Emory Taylor Lyon, 254 N. Pleasant Ave., Ridgewood, N.J.

Filed Jan. 27, 1960, Ser. No. 4,988

3 Claims. (Cl. 219—9.5)

This invention deals with the cementing of semiconductor device components such as those involving silicon rectifiers, germanium diodes, and the like. More specifically, it relates to the imbedding in lead of semiconductor components in such devices.

In the manufacture of semiconductor devices such as, for example, silicon rectifiers, thin wafers of lead are employed as cement (after melting) to keep the components together. The conventional procedure for melting these lead wafers involves heating the assembled devices in a gas or electrically-heated oven at the melting point of the lead and then to cool the cemented devices slowly until they have set. On the average, it takes about ten minutes for cementing together such components. Furthermore, a conveyor is generally used in these heating and cooling operations, and this necessarily involves vibration which is undesirable since it tends to dislocate and cause shortening of the component elements.

In order to speed up this operation, heating by means of conventional high frequency waves (10 to 20 kilocycles) has been attempted. Although a speedier cementing was achieved, it was found that the high frequency destroyed the electrical properties of the semiconductor. Waves of much higher frequency, such as those in the 100–200 kilocycle range, also were attempted to be used, but these also affected adversely the electrical characteristics of the semiconductor. As a result, the heating of such components, to date, has been by conventional gas or electrically-heated ovens.

The purpose of this invention is to cement the semiconductor components rapidly and easily by use of special high frequency waves in the radio frequency range which have been found to exert no adverse effect upon the semiconductor, provided the latter is positioned in a specified manner in the induced current during the heating period.

Figures 1, 2:
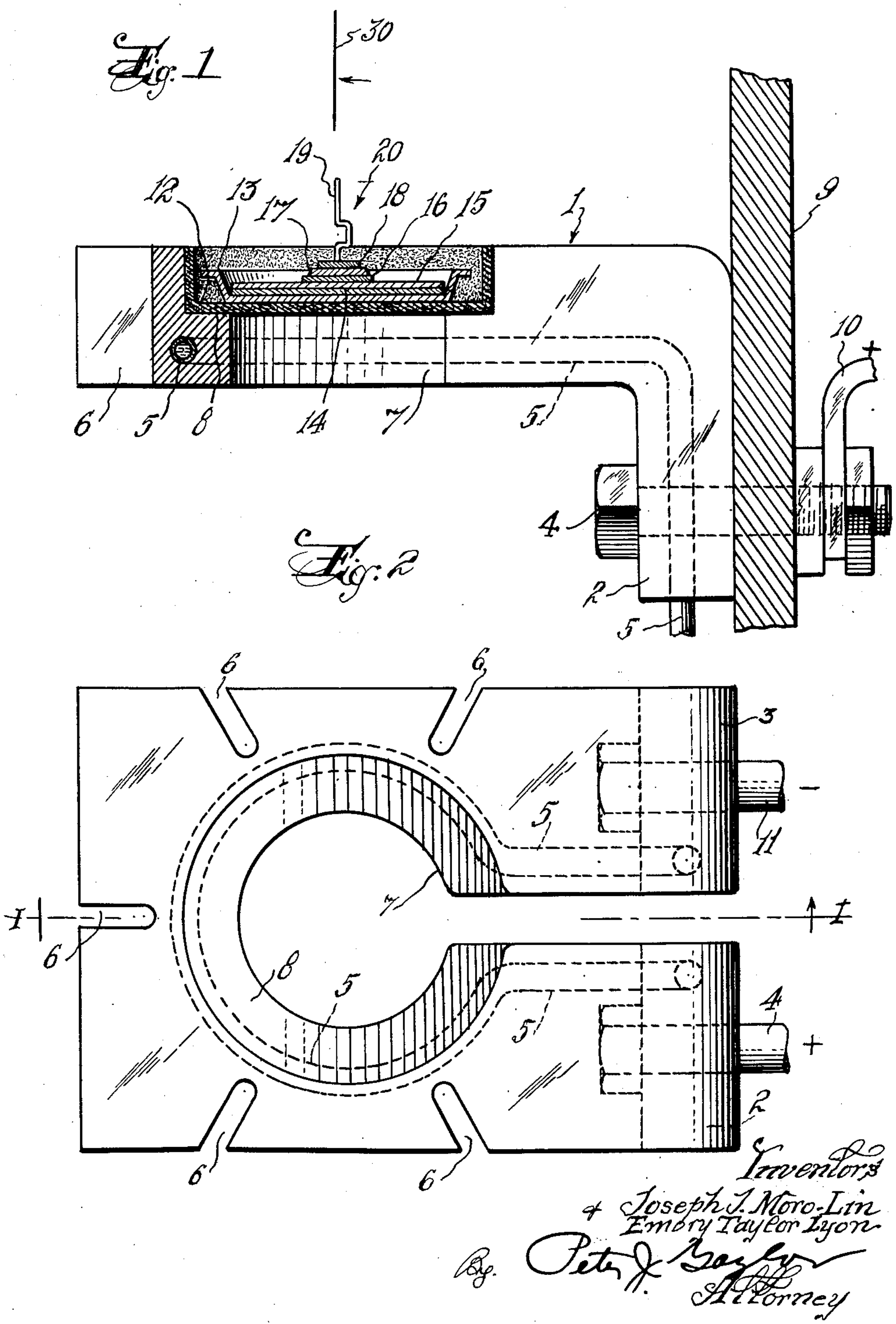
Figure 3:
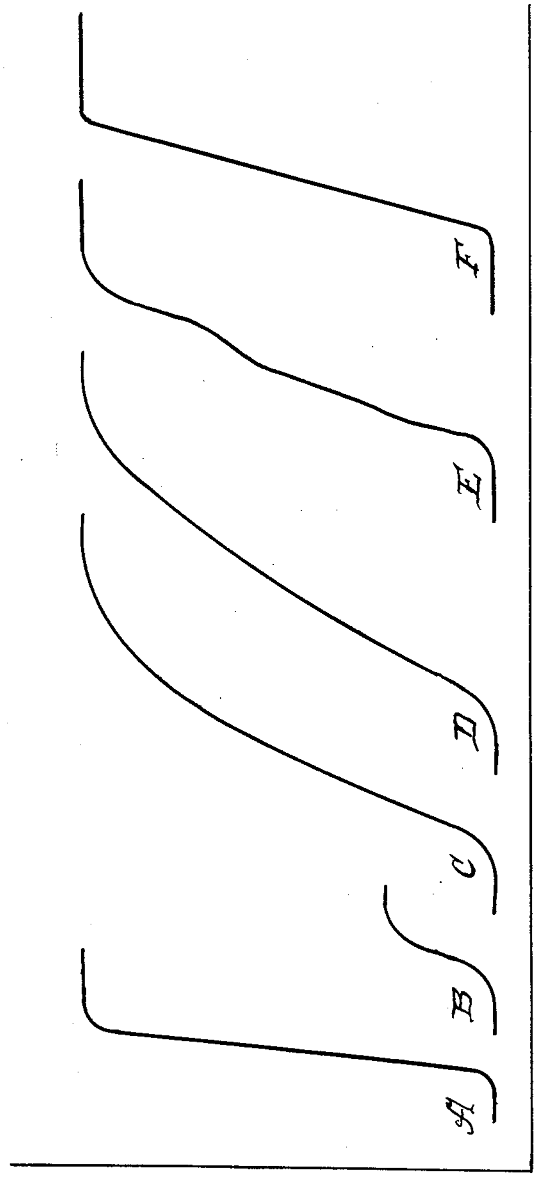

The invention will be more readily understood by reference to the accompanying drawings in which a preferred embodiment is described. FIGURE 1 represents a cross-sectional side view of a heating coil and a silicon rectifier (greatly enlarged) being cemented thereby. A top or plan view of the heating coil alone is depicted in FIGURE 2, while FIGURE 3 shows a series of oscilloscope voltage curves obtained when A.C. current is impressed upon a silicon rectifier prepared under various conditions specified in the examples given herein. Similar numerals refer to similar parts in the various figures.

Referring again to the drawings, numeral 1 represents a copper R.F. coil having legs 2 and 3 for mounting the coil on vertical slate slab 9 by means of conductive bolts 4 and 11 which also serve as inlet and outlet electrical leads, respectively, for the radio-frequency current used. Coil 1 is provided with conventional slots 6 which tend to concentrate the energy toward circular, centrally-disposed opening 7 in which is placed the semiconductor device assembly to be cemented by heating, and indicated generally by the numeral 20. Coil 1 also is provided with an imbedded cooling tube 5 through which cooling water may be circulated. Cut into the copper around opening 7 is ledge 8 for holding the work to be heated. This is covered with a heat-resistant insulating sheet of asbestos or similar material so as to insulate the work from the coil.

It has been found that rapid and efficient cementing of semiconductor materials may be effected without injury to the electrical characteristics of the semiconductor if there is passed through the coil a radio frequency current of at least 400 kilocycles, provided that the surface of the semiconductor wafer is kept perpendicular to the axis 30 of the coil. Furthermore, vibration may be eliminated since a conveyor would not be needed and there is required only means for placing and removing the devices off the coil.

As shown in FIGURE 1, a typical silicon rectifier comprises a circular copper cup-like terminal 13 in which is placed a preformed lead wafer 14, over which is placed a gold-plated copper disk 15. Centrally disposed on this disk is a smaller preformed lead wafer 16 over which is placed the circular semiconductor silicon wafer 17 having parallel sides and tapered edge. Such semiconductor wafers are treated on one side with a phosphorus material and a boron material on the other, and are then plated with nickel and gold. On this silicon wafer is placed a smaller circular wafer of lead 18 on to which the copper wire lead 19 is cemented. For the sake of simplicity, the conventional jigs and guides for positioning and holding the parts have been omitted.

The purpose of the heating operation is to cement together the various semiconductor device components by melting the lead wafers and without detrimentally affecting the electrical characteristics of the semiconductor. As stated above, due to the fact that high frequencies were found to destroy the electrical characteristics of the semiconductor, such assemblies have been cemented up to the present time by means of conventional ovens, the time consumed for each unit amounting to about ten minutes.

According to the present invention, the devices can be cemented together in a short period of 2¾ seconds, the entire heating and cooling time being only about 6 seconds, which greatly increases the manufacturing speed and decreases their cost significantly.

Due to the detrimental effect of high frequency observed on the semiconductor element, tests were conducted under various conditions, and the following examples illustrate some of the results obtained:

*Example 1*

A silicon element (17) from a rectifier was placed in a high frequency heating coil as illustrated in FIGURE 1 and subjected to a 60-second heating-cooling time with a 100 kilocycle current of 10-volt output impressed on coil leads 4 and 11 (via leads 10 from the high frequency source). Thereafter, the silicon wafer was connected to an oscilloscope. An A.C. current was impressed across the wafer and the voltage curve observed on the oscilloscope resembled curve B in FIGURE 3. Upon comparison with the ideal curve A, it is apparent that the electrical characteristics of the semiconductor were adversely affected.

*Example 2*

Another silicon wafer for a rectifier was placed in the high frequency coil as in Example 1 with the exception that the wafer was positioned so that its flat surfaces were parallel to the axis 30 of the coil, i.e., at right angles to the position shown in FIGURE 1. The wafer was subjected to high frequency heating as in Example 1 with a 3 megacycle radio frequency current of a 10-volt output impressed on the coil leads, as in Example 1.

Upon testing, as in Example 1, the oscilloscope curve obtained was similar to curve C of FIGURE 3. Hence, it is apparent that, even with very high radio frequency, the electrical characteristics of the wafer were unsatisfactory.

*Example 3*

Another silicon wafer was placed in the high frequency coil as in Example 2 with the exception that a 400 cycle modulation was impressed upon the 3 megacycle radio frequency current. Upon testing as in Example 1, an oscilloscope curve similar to curve D in FIGURE 3 was obtained. It is apparent that the modulation did not prevent the damage to the electrical characteristics which are affected by the radio frequency current.

*Example 4*

Another silicon wafer was placed in the high frequency coil as in Example 1, i.e., with the flat surfaces perpendicular to the axis 30 of the coil, with the exception that a 400 kilocycle current was impressed upon the coil terminals.

Testing of the wafer as in Example 1 resulted in an oscilloscope curve similar to curve E shown in FIGURE 3, showing that the electrical characteristics of the wafer were only passable.

*Example 5*

Another silicon rectifier wafer was placed in the high frequency coil as in Example 4, but with the exception that a 3 megacycle radio frequency current was impressed upon the coil terminals.

Upon testing, as in Example 1, an oscilloscope curve was obtained similar to curve F in FIGURE 3. It is apparent from these results that the wafer was entirely satisfactory for use. Further tests with modulation impressed upon the radio frequency current showed that modulation had very little adverse effect upon the wafer's electrical properties.

In all of the aforesaid tests, the original wafer, prior to testing, had satisfactory electrical characteristics. Also, it was found that by using higher power outputs than those given in the examples, it was possible to speed up cementing of the semi-conductor assemblies so that they could be heated and cooled in a matter of about 6 seconds without any adverse effect upon the electrical characteristics.

Although the lower limit of the frequency has been established at about 400 kilocycles for obtaining satisfactory results, the data show that frequencies in the megacycle range are preferable, particularly frequencies from 1 to 3 megacycles. Higher frequencies may be used, but they are more difficult to generate and to apply to the production operation in the coil. The position of the semiconductor has been specified to be such that its surface plane be perpendicular to the axis of the coil. In the case where the semiconductor does not have a plane surface, it is understood that the crystal is to be positioned so that its axial relationships be the same as if the crystal were in the form of a slice or conventional wafer.

The process of the present invention, although here directed particularly to silicon semiconductor assemblies, is also applicable to other semiconductor devices such as germanium and other semiconductors in transistors and similar devices, provided the temperature is maintained so as not to exceed the temperature limitation of the semiconductor material, it being understood that other cementing materials and alloys besides lead may be employed also.

We claim:

1. The process of cementing a device, including a semiconductor and a cementing material, in a high frequency coil, comprising subjecting said semiconductor and cementing material to a field of a high frequency current of at least 400 megacycles passed through said coil while holding said device in a position such that the semiconductor flat surface plane is perpendicular to the axis of said coil.

2. The process of cementing a device including silicon semiconductor and lead as a cementing material, in a high frequency coil, comprising subjecting said semiconductor and cementing material to a field of a high frequency current of at least 400 megacycles passed through said coil while holding said device in a position such that the silicon flat surface plane is perpendicular to the axis of said coil.

3. The process of cementing a silicon rectifier including lead as a cementing material, in a high frequency coil, comprising subjecting said rectifier silicon and cementing material to a field of a high frequency current of at least 400 megacycles passed through said coil while holding said rectifier in a position such that the silicon flat surface plane is perpendicular to the axis of said coil.

References Cited in the file of this patent

UNITED STATES PATENTS

| | | |
|---|---|---|
| 2,792,489 | Wahlman | May 14, 1957 |
| 2,798,927 | Lefcourt et al. | July 9, 1957 |
| 2,939,058 | Masterson | May 31, 1960 |
| 2,962,574 | Brooke | Nov. 29, 1960 |